United States Patent [19]
Taniguchi

[11] Patent Number: 5,578,823
[45] Date of Patent: Nov. 26, 1996

[54] TRANSMISSION ELECTRON MICROSCOPE AND METHOD OF OBSERVING ELEMENT DISTRIBUTION BY USING THE SAME

[75] Inventor: Yoshifumi Taniguchi, Ibaraki-ken, Japan

[73] Assignee: Hitachi, Ltd., Tokyo, Japan

[21] Appl. No.: 571,060

[22] Filed: Dec. 12, 1995

[30] Foreign Application Priority Data

Dec. 16, 1994 [JP] Japan .................................. 6-313607

[51] Int. Cl.⁶ ................................................ H01J 37/153
[52] U.S. Cl. ........................................ 250/311; 250/305
[58] Field of Search ................................. 250/311, 305, 250/306, 307, 396 R

[56] References Cited

U.S. PATENT DOCUMENTS

| | | | |
|---|---|---|---|
| 4,789,780 | 12/1988 | Le Poole et al. ......................... | 250/311 |
| 4,812,652 | 3/1989 | Egle et al. ................................ | 250/311 |
| 5,097,126 | 3/1992 | Krivanek ................................... | 250/311 |

OTHER PUBLICATIONS

Proc. 50th Meeting of Japan Society of Electron Microscope, 1994, p. 76.
Electron Micros, vol. 44, No. 2, 1995, pp. 86–90, Joji Kimoto et al.: *Elemental Mapping Using a Field Emission Transmission Electron Microscope with an Imaging Filter.*
Proc. 51st Meeting of the Microscopy Society of America, 1993, pp. 586–587: O. L. Krivanek et al.: *Elemental Mapping with an Energy-Selecting Imaging Filter.*
JP. J. Appl. Phys., KvOL. 33 (1994) pp. 1 1642–1 1644, 15 Nov. 1994, Joji Kimoto et al.: *High LSpatial Resolution Elemental Mapping of Multi-layer Using a Field Emission Transmission Electron Microscope Equipped with an Imaging Filter.*

*Primary Examiner*—Jack I. Berman
*Assistant Examiner*—Kiet T. Nguyen
*Attorney, Agent, or Firm*—Kenyon & Kenyon

[57] ABSTRACT

A transmission electron microscope system equipped with an energy filter and capable of displaying a two-dimensional distribution map of element of concern on a real time basis. A transmission electron microscope incorporating an energy filer is equipped with a television camera for recording two types of energy-loss images in separate frame memories, respectively. For effecting background processing for image data, intensity of an image to be stored in one frame memory is attenuated with a constant ratio by an intensity regulating mechanism. A signal indicative of difference between the image data stored in the respective frame memories is outputted to a monitor as a picture signal.

13 Claims, 6 Drawing Sheets

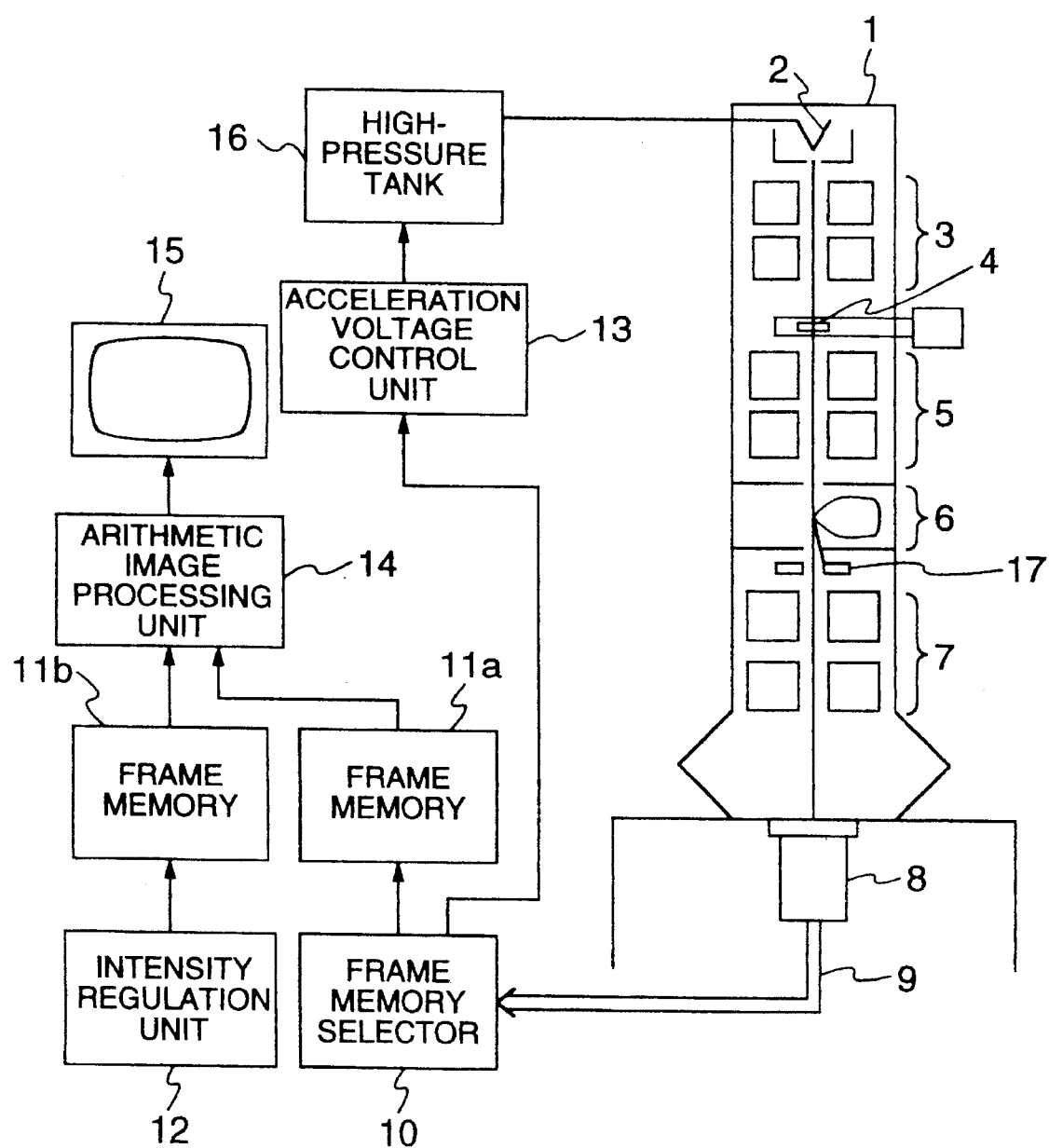

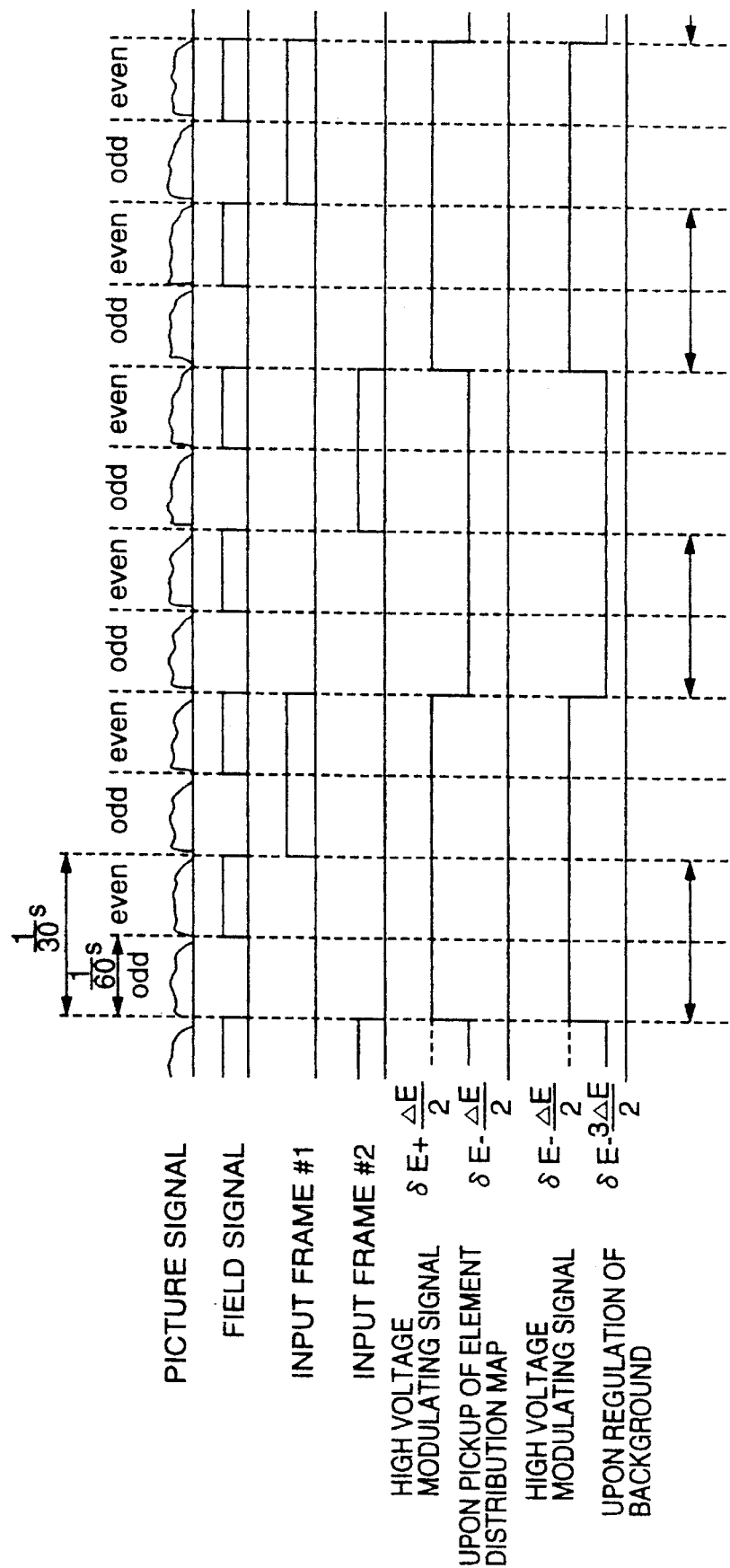

TRANSMISSION ELECTRON MICROSCOPE AND METHOD OF OBSERVING ELEMENT DISTRIBUTION BY USING THE SAME

BACKGROUND OF THE INVENTION

1. Field of the Invention

The present invention generally relates to a transmission electron microscope. More specifically, the invention is concerned with a transmission electron microscope equipped with an energy filter for spectrally separating only electrons that have specific energy from those transmitted through a specimen to thereby make it possible to obtain an element distribution or map image of a minute or fine region. The invention is further concerned with a method of observing element map or distribution by using the transmission electron microscope equipped with the energy filter.

2. Description of the Related Art

The transmission electron microscope is an apparatus for magnifying a specimen image for observation by using an electron beam and electron lenses and is employed for identifying a fine structure of a specimen. On the other hand, the energy filter is a device for spectrally filtering or separating the electron beams transmitted through the specimen for thereby extracting only the electrons having a specific width of energy. By combining the transmission electron microscope with the energy filter, there can be realized a transmission electron microscope system which allows an image formed only by electrons having a specific energy width.

In the transmission electron microscope equipped with the energy filter for which adjustment of the optical axis has been completed, it is possible to obtain an electron image (zero-loss image) formed by only those electrons which have undergone elastic scattering by inserting an energy selecting slit on the optical axis. By increasing the acceleration voltage for the incident electron beam by δE for observation, electrons having lost energy by δE upon transmission through a specimen are caused to pass through the energy selecting slit after having passed through the energy filter. Accordingly, energy-filtered image formed by electrons having lost the energy by δE can be obtained by increasing the acceleration voltage by δE.

Electrons having transmitted through a specimen lose energy due to inelastic scattering, as exemplified by plasmon loss and core loss, to exhibit an energy spectrum. The core-loss energy is a quantity inherent to elements constituting the specimen. Accordingly, the transmission electron microscope image formed by electrons undergone a specific energy loss exhibits two-dimensional distributions corresponding to elements constituting the specimen, respectively. However, the energy loss due to the inelastic scattering spreads over a wide energy range, giving rise to overlap of information of other element(s) as the background. Unless the background is separated to be eliminated, there can be obtained no intrinsic elemental distribution or map image. For separation and elimination of the influence of the background to thereby obtain a distribution or map image of specific elements, there have heretofore been proposed two types of methods among others, which will be mentioned below.

In a first method, two images in total are used, i.e., an energy-filtered image obtained by providing an energy window in a region of core-loss energy and an energy-filtered image obtained by providing an energy window at a region immediately preceding to the region of core-loss energy for suppressing the influence of core-loss electrons. According to this method, the two images mentioned above are inputted to a computer with the aid of an image pickup device such as a television camera. By regarding the second mentioned image as the background for the first mentioned image, inter-image subtraction processing is executed within the computer for subtracting the second mentioned image from the first mentioned image, to thereby separate the background for eliminating the influence thereof. In this way, a two-dimensional distribution of specific elements can be obtained.

In a second method, there are used three images in total. More specifically, in addition to the two energy-filtered images used in the first method described above, another energy-filtered image is generated by providing an energy window in a region which contains no core-loss electrons and which differs from the regions mentioned previously in conjunction with the first method. According to the second method, the three images are inputted to a computer by means of an image pickup device such as a television camera, whereupon on the basis of the two images formed by electrons including no core-loss electrons, change of the background intensity for a change of energy is determined for all the pixels by the computer, and the accurate background intensity of the energy-filtered image formed by electrons including core-loss electrons is arithmetically determined or calculated for all the pixels of the image. By subtracting the background intensity determined in this manner, influence of the background is separated and eliminated, whereby a two-dimensional distribution or map image of specific elements can be obtained.

In the case of the first method, there exists difference between the background intensity used in the arithmetic operation and the intrinsic background intensity. Accordingly, although the arithmetic processing is simple, the first method is disadvantageous in respect to the quantativeness.

On the other hand, with the second method, it is certainly possible to determine the intrinsic background with high accuracy by using two images. However, because the arithmetic processing has to be performed for all the pixels of the image, a lot of time is taken for the calculation. Parenthetically, it is reported that the time taken for such calculation amounts to about one minute at the shortest even when a high-performance computer is employed (see Koji Kimoto, Tatsumi Hirano, Katsuhisa Usami, Naruto Sunakozawa and Toshitaka Taya: Proc. 50th Meeting of the Microscopy Society of Japan, (1994) 76). Such being the circumstances, feedback of the result of the processing in the course of experiment is rendered impossible.

In the case of the first method, the time taken for the arithmetic operation is relatively short when compared with the second method. However, difficulty will be encountered in an attempt for applying the first method for observation of a specimen in which distribution of elements of interest changes in continuation as the time lapses as well as a specimen which deforms progressively. Furthermore, for a specimen which is drifting, arithmetic operation for manipulation such as renewal position alignment will be required. Of course, use of a high-performance computer is undesirable from the economical viewpoint.

At this juncture, it should also be mentioned that the position and the width of the energy window are important factors for evaluating the quality of the image obtained finally and quantitativeness of the elemental distribution or map image. Accordingly, it is desirable that these factors can be set optimally during experiment. However, unless the real-time processing is possible, setting of such optimal conditions will have to rely on the experiences of a person conducting the experiment, presenting thus a problem which is difficult to solve technically. Besides, the conventional methods suffer a drawback that in the course of calculating the background, pixel-to-pixel errors will be involved due to noise components contained in the image, as a result of which the S/N ratio is degraded, giving rise to another problem.

SUMMARY OF THE INVENTION

In the light of the state of the art described above, it is an object of the present invention to provide an improved transmission electron microscope equipped with an energy filter which can solve successfully the aforementioned problems of the prior art.

Another object of the invention is to provide a method of observing a distribution or map image of specific elements by using the improved transmission electron microscope mentioned above.

In view of the above and other objects which will become apparent as the description proceeds, there is provided according to a general aspect of the present invention a transmission electron microscope system which includes an electron gun, an irradiating electron lens system for irradiating a specimen with an electron beam emitted from the electron gun, an image forming electron lens system for forming an image of electrons having passed through the specimen, an energy filter for spectrally filtering or separating electron beams produced after transmission through the specimen in dependence on energies thereof, a selecting member for selecting only the electron beam having specific energy from the electron beams resulting from the spectral filtering or separation, an image pickup device for taking an image formed by electrons of the selected electron beam, a plurality of frame memories for storing the selected images picked up by the image pickup device, a frame memory selecting circuit for selecting periodically the frame memories for storing in the selected frame memories the images picked up by the image pickup device, respectively, an acceleration voltage regulator for changing an acceleration voltage for the electron beam in synchronism with selection of the frame memory by the frame memory selecting circuit, and an arithmetic unit for comparing and arithmetically processing the images stored in two of the frame memories on a pixel-by-pixel basis to thereby output a corresponding picture signal.

In a preferred mode for carrying out the invention, the transmission electron microscope system may include a circuit provided at an input or output side of at least one of the plurality of frame memories for modulating intensity of the image with a preset constant ratio, and a subtraction arithmetic unit for outputting as the picture signal a signal indicative of difference in the intensity between the image whose intensity is modulated by the intensity modulating circuit and an image stored in another one of the plural frame memories.

Alteratively, a division image may be obtained by performing division on the image signals stored in two of the frame memories to be thereby outputted as the picture signal.

The image intensity changing or modulating circuit may be constituted by an electric circuit designed to attenuate the image signal with a preset attenuation ratio or alternatively by a circuit for regulating an excitation current for the irradiating electron lens system of the transmission electron microscope.

Further, the transmission electron microscope system may include an output circuit which is designed to output along lapse of time the picture signal determined by comparison and the arithmetic processing performed on a pixel-by-pixel.

Furthermore, according to another aspect of the present invention, there is provided a method of observing a distribution of elements of concern contained in a specimen by using a transmission electron microscope system, which method includes a first step of spectrally separating electron beams transmitted through a specimen under observation for picking up an energy-selected image formed by an electron beam having second energy other than first energy undergone energy loss equivalent to core-loss energy of elements of concern to thereby store the energy-selected image in a first frame memory, a second step of spectrally separating electron beams transmitted through the specimen for picking up an energy-selected image formed by an electron beam having third energy exhibiting an energy difference relative to the second energy, which difference is equal to a difference between the first and second energies, to thereby store the image formed by the electron beam of the third energy in a second frame memory after uniform attenuation of image intensity on a pixel-by-pixel basis, a third step of determining difference between the filtered image stored in the first frame memory and the filtered image stored in the second frame memory on a pixel-by-pixel basis to thereby output the difference onto a picture display unit as a picture signal, a fourth step of setting the image intensity attenuation ratio in the second step such that contrast of the picture displayed on the picture display unit in the third step makes disappearance, a fifth step of spectrally separating electron beams transmitted through the specimen to pick up a picture of an energy-selected image formed by the electron beam having the first energy for thereby storing the energy-selected image in the first frame memory, a sixth step of spectrally separating electron beams transmitted through the specimen to pick up a picture of an energy-selected image formed by the electron beam having the second energy for thereby storing the energy-selected image in the second frame memory while attenuating image intensity thereof uniformly on a pixel-by-pixel basis with the attenuation ratio determined in the fourth step, and a seventh step of determining difference between the image stored in the first frame memory in the fifth step and the image stored in the second memory in the sixth step to thereby output a signal indicative of the difference to the picture display unit as a picture signal. In the fifth and sixth steps, the energy-selected images having the first and second energies, respectively, can be generated by controlling correspondingly an electron beam accelerating voltage. A map of two-dimensional distribution of elements of concern having background eliminated can be obtained by repetitionally executing the fifth to seventh steps.

In the method described above, the image is stored in the second frame after the intensities of the individual pixels have been uniformly attenuated. However, the intensity may be attenuated after the image has been stored in the second frame.

Additionally, according to a further aspect of the present invention, there is provided a method of observing a distribution of elements of concern contained in a specimen by using a transmission electron microscope system, which method includes a first step composed of a procedure for spectrally separating electron beams transmitted through a specimen under observation for picking up an energy-selected image formed by an electron beam having second energy other than first energy undergone energy loss equivalent to core-loss energy of elements of concern to thereby store the energy-selected image in a first frame memory and a second procedure for spectrally separating electron beams transmitted through the specimen to pick up a picture of an energy-selected image formed by the electron beam having the first energy for thereby storing the energy-selected image in a second frame memory, and a second step of dividing intensities of the image stored in the first frame memory and the image stored in the second frame memory on a pixel-by-pixel basis to thereby output a signal indicative of the result of the division (i.e., intensity ratio) to the picture display unit as a picture signal. A map of two-dimensional distribution of elements of concern having background eliminated can be obtained by repetitionally executing the first and second steps.

With the arrangement described above in which intensity difference or intensity ratio between the images stored in the two frame memories, as determined on the pixel-by-pixel basis, is outputted as the picture signal, it is possible to observe the difference or ratio among a plurality of energy-filtered images having different loss energies.

More specifically, upon determination of the difference, subtraction is performed after the energy image constituting the background has been changed uniformly with a predetermined ratio. Consequently, the background image intensity can be determined accurately for the energy filter which realizes the inter-image subtraction, whereby a quantitative elemental distribution image can be obtained.

On the other hand, in the case of the arrangement in which the intensity ratio is derived by the division on the basis of the relation between the background and the specimen, there can be obtained a uniform contrast ratio in the region where elements of concern are absent, whereas in a region where elements of concern are present, the contrast ratio differs from that of the region where elements of concern are absent. Thus, the distribution image of elements of concern can be obtained.

Further, by virtue of the arrangement for outputting the images along lapse of time (i.e., as the time lapses), distribution of elements of concern can be observed even when the element distribution changes in continuation as a function of time or when a specimen deforms progressively or even when a specimen is drifting. Moreover, because not only the position of the specimen but also the position and the width of the energy window can be set in the course of observation of element distribution image (i.e., along lapse of time), setting of the optimal conditions can easily be accomplished. The advantageous effects mentioned above can be ensured even when the picture signals as obtained are outputted periodically at a predetermined time interval, not to say of the case where all the picture signals are sequentially outputted one by one.

Further, because of no need for use of a high-performance computer, the transmission electron microscope system according to the invention can enjoy advantage from the economical viewpoint as well.

BRIEF DESCRIPTION OF THE DRAWINGS

In the course of the description which follows, reference is made to the drawings, in which:

FIG. 1 is a block diagram showing a transmission electron microscope system according to an embodiment of the present invention;

FIG. 2 is a time chart for illustrating flows of processings;

DESCRIPTION OF THE PREFERRED EMBODIMENTS

Figure 3A:
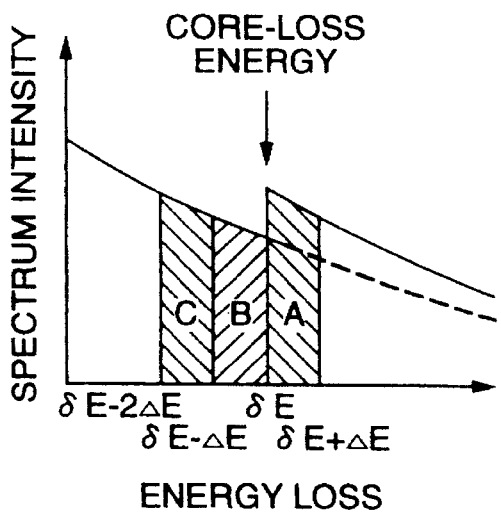
FIGS. 3A to 3G are views for illustrating a method of determining a two-dimensional distribution image of elements of concern (i.e., specific elements)

Now, the present invention will be described in detail in conjunction with what is presently considered as preferred or exemplary embodiments thereof by reference to the drawings.

FIG. 1 is a block diagram showing a transmission electron microscope system according to an embodiment of the present invention. Referring to the figure, reference numeral 1 denotes generally an transmission electron microscope which is equipped with an energy filter. An electron beam emitted from an electron gun 2 is accelerated under the effect of a high voltage generated by a high-pressure tank 16 to be projected onto a specimen 4 by means of an irradiating electron lens system 3. A major part of the electron beam or electrons transmit through the specimen 4 without losing energy. However, those electrons undergone energy loss in dependence on elements constituting the specimen 4 due to inelastic scattering are spectrally filtered by an energy filter 6 after passing through an image forming electron lens system 5, as a result of which an energy spectrum is generated on an energy selecting slit 17. By making adjustment of the transmission electron microscope 1 such that only the zero-loss electrons can pass through the energy selecting slit 17, a zero-loss image formed by a final image forming electron lens system 7 can be observed with the aid of an image pickup device 8 such as a television camera.

When the acceleration voltage is increased by δS by means of an acceleration voltage control unit 13, electrons undergone energy loss by δE in the specimen 4 can pass through the energy selecting slit 17 after having been spectrally filtered by the energy filer 6. Thus, an energy-filtered image formed by those electrons having lost energy by δE can be observed through the medium of the image pickup device 8.

By using a synchronizing signal contained in a control signal for the image pickup device 8 or a synchronizing signal contained in a picture signal 9 obtained from the image pickup device 8, pictures can be separated from one another by means of a frame memory selector 10 on a frame-by-frame basis. The individual frames of the energy-filtered images resulting from the separation are sequentially stored in a plurality of frame memories 11a, 11b on a frame-by-frame basis. Although two frame memories are shown in FIG. 1, it should be appreciated that three or more frame memories can be employed. The frame memory selector 10 is so arranged as to select one frame from plural frame memories 11a, 11b periodically by using the synchronizing signal mentioned above to thereby store the energy-filtered image.

Further, the frame memory selector 10 is also adapted to control the acceleration voltage control unit 13 so that the acceleration voltage is incremented by $\delta E_1$ for selecting the frame memory 11a while incrementing the acceleration voltage by $\delta E_2$ upon selection of the frame memory 11b. As a consequence, a filtered image of electrons having lost energy by $\delta E_1$ is inputted to the frame memory 11a, while a filtered image of electrons undergone energy loss by $\delta E_2$ is inputted to the frame memory 11b. In this conjunction, it should be mentioned that the acceleration voltage can be controlled at a high speed by resorting to appropriate control technique known in the art.

An arithmetic image processing unit 14 compares the images of the frame memories 11a and 11b with each other through arithmetic processing, the results of which are successively outputted to a monitor 15. The arithmetic processing executed by the arithmetic image processing unit 14 is either an inter-image subtraction processing or an inter-image division processing. An intensity regulation unit (also referred to as amplitude regulation unit) 12 is a mechanism for attenuating the intensity of the energy-filtered image inputted to the frame memory 11b uniformly with a predetermined ratio. It is presumed that the ratio of attenuation can arbitrarily be selected. The ratio of attenuation may be selected to be "1" (unity), although it is unnecessary when the inter-image division processing is performed.

Next, a procedure for observing a distribution or map of those elements constituting the specimen which have core-loss energy of $\delta E$ will be described by reference to a time chart of FIG. 2 together with FIGS. 3A–3G. Parenthetically, it should be mentioned that in the case of the example illustrated in FIGS. 3A–3G, the inter-image subtraction processing is applied.

(1) The picture signal 9 is segregated into odd-numbered frames and the even-numbered frames by means of the frame memory selector 10, wherein a signal which assumes a high level for the odd-numbered field is generated. This signal will hereinafter be referred to as the field signal.

(2) The width of an energy window selected by the energy selecting slit 17 is set to $\delta E$. At this stage, a zero-loss image can be observed.

(3) The acceleration voltage is modulated in synchronism with a falling edge of the field signal mentioned above. To this end, modulating voltages of $\delta E-(1/2)\Delta E$ and $\delta E-(3/2)\Delta E$ are employed. As a result of the modulations of the acceleration voltage, there will be selected the energy windows, i.e., energy losses ($\delta E-\Delta E$, $\delta E$) and ($\delta E-2\Delta E$, $\delta E-\Delta E$) which correspond to windows B and C shown in FIG. 3A. By taking into consideration deviations in respect to the time points at which the electric charges are stored at the pixels, the modulation is effectuated for every other (or every second) frame.

(4) With the aid of the frame memory selector 10, the picture data of the picture signal 9 are alternately assigned to the frame memories 11a and 11b, respectively. Further, the frame data obtained immediately after the modulation of the acceleration voltage is discarded so that the image data of the second frame are inputted to the frame memories 11a and 11b. Through this procedure, an energy-loss image B' of $\delta E-\Delta E$ to $\delta E$ shown in FIG. 3B is inputted to the frame memory 11a, while an energy-loss image C' of $\delta E-2\Delta E$ to $\delta E-\Delta E$ shown in FIG. 3C is stored in the frame memory 11b. At this juncture, it should be mentioned that in the pictures or images shown in FIGS. 3B to 3G, the density of hatching represents schematically the density of detected electrons or brightness (intensity) of the image and that image of the area hatched with higher density is displayed with higher brightness.

Figure 3B:
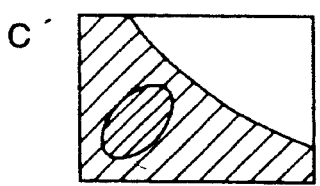
Figure 3C:
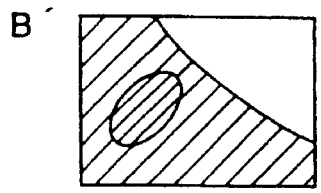
Figure 3D:
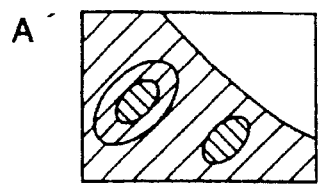
Figure 3E:
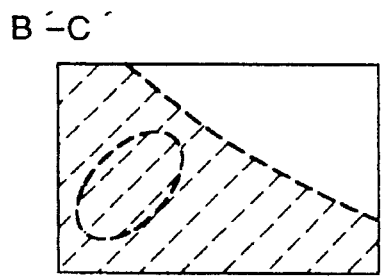
Figure 3F:
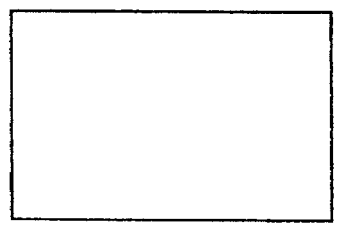

(5) Because of difference in the intensity between the energy-loss images B' and C', the subtracted image (B'−C') outputted from the arithmetic image processing unit 14 exhibits a contrast corresponding to the intensity difference between the energy-loss images B' and C' shown in FIG. 3E. Accordingly, an attenuation constant by which the picture signal stored in the frame memory 11b is to be multiplied is determined by using the intensity regulation unit 12 so that the contrast mentioned above makes disappearance. Owing to this processing, changes of the background as brought about due to the difference in the energy level can be corrected or canceled out. Thus, the subtracted image resulting from subtraction of the image of the frame memory 11b from that of the frame memory 11a can be represented by (B'−C' attenuation constant), whereby the image or picture having the contrast eliminated can be displayed on the monitor 15, as is shown in FIG. 3F.

Figure 3G:
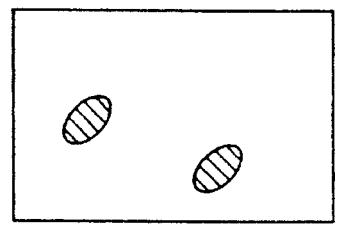

(6) By increasing the acceleration voltage of the transmission electron microscope by $\Delta E$ as a whole, the energy-loss image of $\delta E$ to $\delta E+\delta E$ is inputted to the frame memory 11a while the energy-loss image of $\delta E-\Delta E$ to $\delta E$ inputted to the frame memory 11b. The former corresponds to the image or picture A' shown in FIG. 3D with the latter corresponding to the picture B' shown in FIG. 3C. At this time point, however, the regulation by the intensity regulation unit 12 has not been completed yet. Accordingly, the energy-loss image B' having the intensity attenuated forms precisely the background for the energy-loss image A'. Consequently, the subtraction image outputted from the arithmetic image processing unit 14 and given by (A'−B'×attenuation constant) represents a two-dimensional map of elements of concern from which the background has been eliminated, as shown in FIG. 3G.

Since the data inputting to the frame memories 11a and 11b is performed at a two-video-frame rate (2/30 second), the subtracted image is outputted onto the monitor 15 at every 2/20 second, which means that the two-dimensional map of elements of concern can be observed on a real-time basis. Accordingly, this method can equally be applied to a specimen which changes continuously or deforms progressively as the time lapses. By way of example, even in the case where the specimen is drifting, there arises no necessity of performing positional alignment again in the processing.

In the situation in which observation is possible in the course of time lapse, the result of the processing described above can instantaneously be fed back to the experiment which is being currently carried out. Thus, the position and the width, for example, of the energy window can be adjusted so that the elemental map image exhibits optimal contrast and S/N ratio by observing the picture generated on the monitor 15. In this way, the manipulations involved in the processings mentioned above which have heretofore been realized by relying on the experiences of a person who is conducting the experiment and which have been technically difficult can easily be carried without need for skillfulness according to the teachings of the present invention.

All the mechanisms and devices additionally provided for the transmission electron microscope equipped with the energy filter 6 according to the present invention can be implemented by using simple analogue or digital circuits. Besides, because high-performance computers which have heretofore been required in the art can be spared, the transmission electron microscope according to the invention can enjoy a great advantage from the economical viewpoint as well.

Since the acceleration constant employed in the intensity regulation unit 12 for the multiplication mentioned previously is constant or uniformized over the whole image or picture, noise components contained in the energy-filtered image can never be emphasized differing from the prior art according to which the change in the background intensity as brought about by change of energy is determined for each of the pixels. Additionally, the S/N ratio can be improved through simple cumulation of the output images of the arithmetic image processing unit 14. Besides, the image processing such as contour emphasis of the elemental distribution map or pseudo-color display thereof may be performed on the image outputted from the arithmetic image processing unit 14.

The intensity regulation unit 12 may be disposed at either position downstream of the frame memory 11b or upstream side thereof. By way of example, the intensity regulation unit 12 shown in FIG. 1 may be disposed between the frame memory 11b and the arithmetic image processing unit 14. Additionally, various methods can be employed for attenuating the intensity of the picture signal. By way of example, the picture signal intensity attenuation can be realized by using an electric circuit such as a resistance divider circuit, an arithmetic circuit designed for performing the arithmetic processing mentioned previously after elimination of noise components with reference to a constant threshold level, modulation of a control voltage of a photo-multiplier tube of the image pickup device 8 or modulation of the intensity of the electron beam for irradiating the specimen by correspondingly controlling excitation of the irradiating electron lens system 3 of the transmission electron microscope 1.

At this juncture, it should further be mentioned that the energy windows B and C need not necessarily be generated adjacent to the energy window A as shown in FIG. 3A. In other words, there may exist a distance between the energy window A and the energy window B. However, in the case where the background of the picture A' is to be eliminated by subtraction by using the picture B' and the attenuation constant determined on the basis of the picture C' and B', it will be required to position the energy windows C, B and A on and along the energy axis with an equi-distance therebetween.

In the case of the transmission electron microscope shown in FIG. 1, only one intensity regulation unit 12 is provided, wherein the picture C' undergone the intensity attenuation in the intensity regulation unit 12 and the picture B' not attenuated are subjected to the subtraction processing in the arithmetic image processing unit 14. However, such arrangement may equally be adopted substantially to the same effect in which the intensity regulation unit 12 is provided in association with each of the frame memories 11a and 11b, respectively, wherein different attenuation constants are imparted to these intensity regulating mechanisms, respectively. In this conjunction, it should further be mentioned that in place of attenuating the picture signals with these intensity regulating mechanisms, they may be amplified with gains differing from one another.

As is known in the art, a slow-scan CCD (charge coupled device) camera is utilized for observation of electron-microscopic images or in digital image processing because the slow-scan CCD camera has a greater number of pixels and wider dynamic range than the conventional television cameras. The exposure time for the CCD camera can arbitrarily be selected in a range from a faction second to several seconds. When the slow-scan CCD camera is employed in carrying out the present invention, the processing described hereinbefore can be completed within several seconds at the longest even though the observation on the real-time basis as in the case of the conventional television camera is impossible. By equipping both the conventional television camera and the slow-scan CCD camera, it is possible to perform the adjustment or regulation, specimen location, optimal condition setting with the aid of the television camera wile the slow-scan CCD camera is used for acquiring data to be saved.

The energy filter 6 shown in FIG. 1 is of an in-column type and positioned internally of the column of the transmission electron microscope 1. It should however be mentioned that the present invention can equally be applied to the transmission electron microscope equipped with a post-column type energy filter disposed at a position downstream of the final image plane of the transmission electron microscope 1.

Figure 4A:
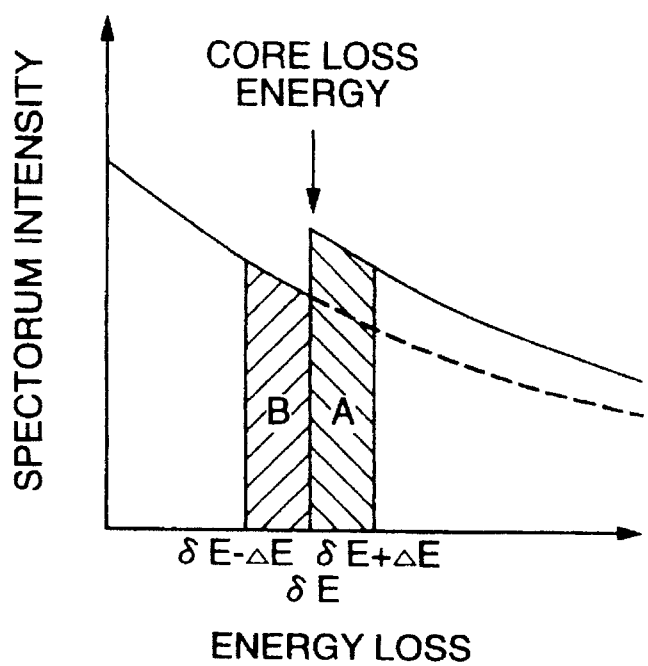
FIGS. 4A to 4D are views for illustrating a simplified method of determining an element distribution map.
Figure 4B:
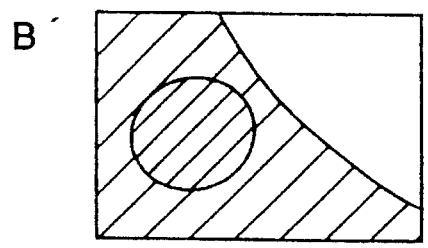
Figure 4C:
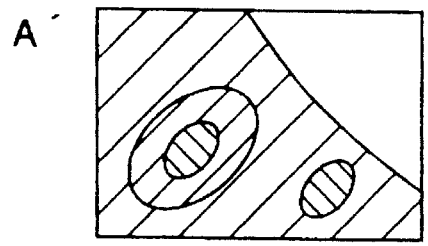
Figure 4D:
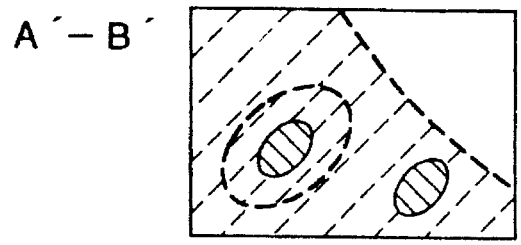

In the structure shown in FIG. 1, the intensity regulation unit 12 may be spared so that the energy-loss image of $\delta E$ to $\delta E+\Delta E$ is inputted to the frame memory 11a with the energy-loss image of $\delta E-\Delta E$ to $\delta E$ being inputted to the frame memory 11b. In that case, the energy-loss image stored in the frame memory 11a will be such as a picture A' shown in FIG. 4C while the energy-loss image stored in the frame memory 11b corresponds to a picture B' shown in FIG. 4B. In that case, a subtraction image A'–B' outputted from the arithmetic image processing unit 14 will be such as shown in FIG. 4D, which is equivalent to the two-dimensional elemental map image resulting from correction of the background by the first method described hereinbefore in conjunction with the related art.

Further, by disabling the functions of the frame memory selector 10 and the arithmetic image processing unit 14, the signal outputted from the image pickup device 8 is directly inputted to the monitor 15, whereby a system equipped with the conventional image pickup device can be realized.

Next, by reference to FIG. 5, description will be made of a transmission electron microscope system in which an inter-image division processing is adopted according to another embodiment of the present invention.

Figure 5:
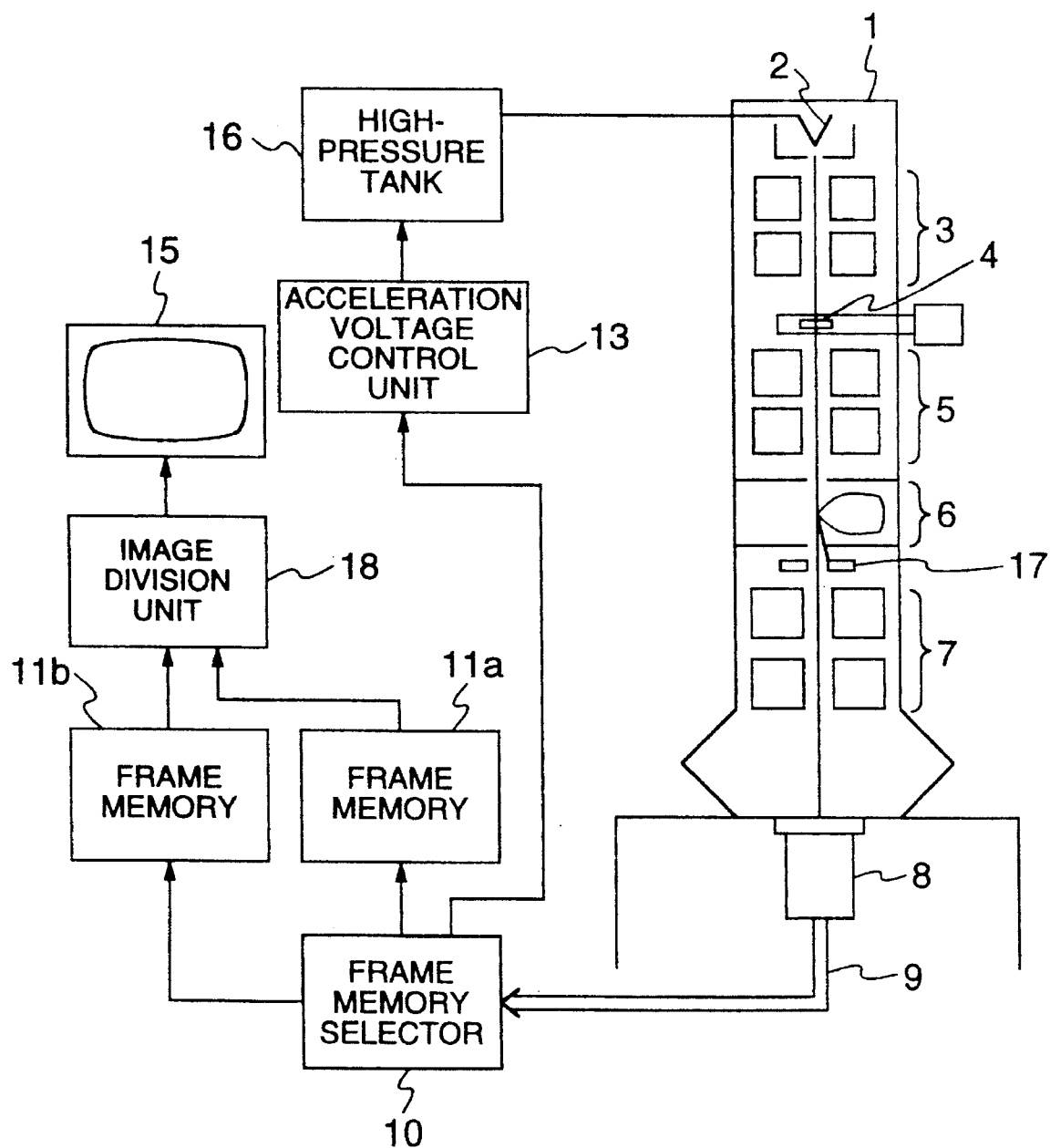
FIG. 5 is a block diagram showing a transmission electron microscope system according to another embodiment of the present invention.

The transmission electron microscope system shown in FIG. 5 differs from that shown in FIG. 1 essentially in the respects that the intensity regulation unit is absent and that the arithmetic image processing unit 14 is replaced by an image division unit 18. In other words, the transmission electron microscope system shown in FIG. 5 can be implemented in much simplified structure when compared with that of the system shown in FIG. 1 because only the image division processing is employed for the arithmetic image processing.

Parenthetically, arrangement in which the division is used as the arithmetic image processing is described in O. L. Krivanek, A. J. Gubbens, M. Kundmann and G. C. Carpenter: Proc. 51st Annual Meeting of the Microscopy Society of America. 586–587 (1993). According to this prior art method, there are used two frames of energy-filtered images obtained by providing an energy window at a region immediately preceding to the core-loss energy region for thereby suppressing influence of a core-loss current.

According to the teachings of the present invention incarnated in the instant embodiment, the pictures mentioned above are inputted into a computer through the medium of an image pickup device. By making use of such characteristic that in a region containing no element of interest, intensity of one picture decreases uniformly relative to the intensity of the other picture, whereas in a region containing elements of interest, the intensity of the former changes in dependence on density or concentration of elements of concern, the intensity ratio between the pictures stored in the two frame memories is derived on a pixel-by-pixel basis as a video or picture signal to thereby allow the intensity ratio between the plural energy filter images of different energies to be displayed as a function of time lapse.

Figure 6A:
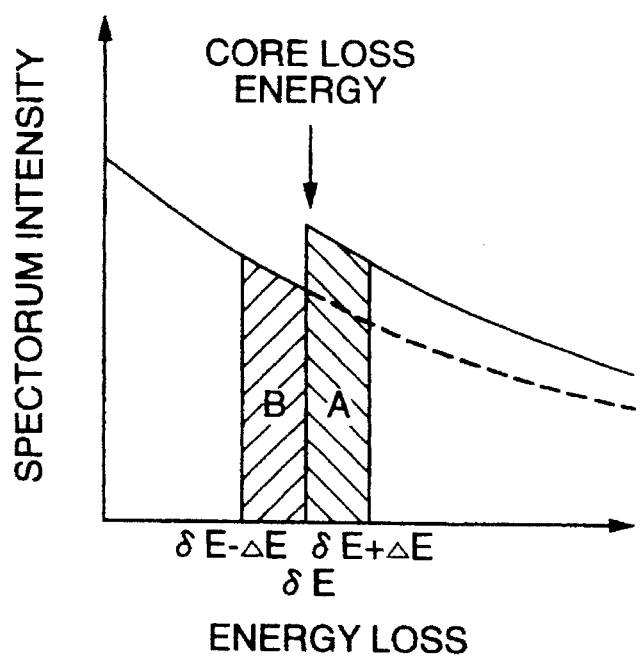
FIGS. 6A to 6D are views for illustrating a method of determining a two-dimensional distribution image of elements of concern.
Figure 6B:
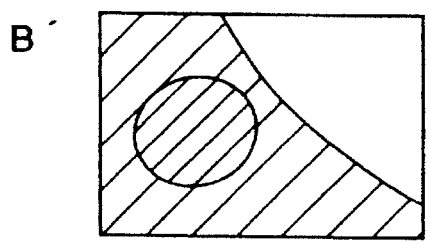
Figure 6C:
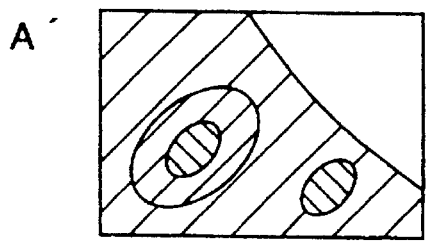
Figure 6D:
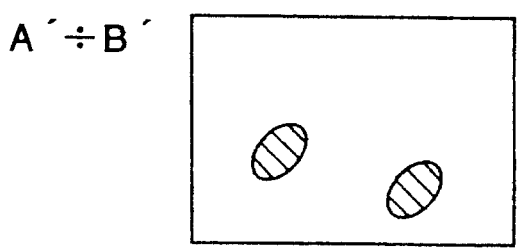

More specifically, when the energy-loss image of δE to δE+ΔE is inputted to the frame memory 11a with the energy-loss image of δE–δE to δE being inputted to the frame memory 11b, the former will then correspond to a picture A' shown in FIG. 6C with the latter corresponding to a picture B' shown in FIG. 6B. In that case, the division picture (A'+B') outputted from the arithmetic image processing unit 14 will be such as shown in FIG. 6D which is equivalent to two-dimensional map image of elements of interest from which the background has been eliminated.

By executing the processing described above periodically for each of the frame memories, the intensity ratios between both the pictures can be obtained along the time lapse. Thus, the map or distribution of elements of concern can easily be confirmed even for the specimen of which elemental distribution changes as a function of time lapse or form of which varies in the course of time lapse.

Further, although the pictures obtained at every 4/30 second are displayed in the course of time lapse, as can be seen from FIG. 2, the time interval for the display may be so set that the picture is displaced once for one second or two seconds. In that case, the pictures as obtained are displayed intermittently on a frame-by-frame basis. However, pictures of a specimen of which element distribution changes continuously as a function of time or of which form varies gradually or which is drifting can easily be confirmed, as a result of which two-dimensional distribution of elements of concern undergone the background correction can be obtained in the course of time lapse.

As is apparent from the foregoing description, the two-dimensional distribution image of elements of concern which has been corrected in respect to the background can be obtained along the time lapse.

I claim:

1. A transmission electron microscope system, comprising:

an electron gun;

an irradiating electron lens system for irradiating a specimen with an electron beam emitted from said electron gun;

an electron image forming electron lens system for forming an image of electrons having passed through said specimen;

an energy filter for spectrally filtering electron beams produced after transmission through said specimen in dependence on energies thereof;

means for selecting only the electron beam having specific energy from the electron beams resulting from said spectral filtering;

image pickup means for taking an image formed by said selected electron beam;

a plurality of frame memories for storing the selected image picked up by said image pickup means;

frame memory selecting means for selecting periodically said frame memories for storing in the selected frame memories the images picked up by said image pickup means, respectively;

means for changing an acceleration voltage for said electron beam in synchronism with selection of the frame memory by said frame memory selecting means; and means for comparing and arithmetically processing the images stored in two of said frame memories on a pixel-by-pixel basis to thereby output a corresponding picture signal.

2. A transmission electron microscope system according to claim 1, further including means provided at an input or output side of at least one of said plurality of frame memories for modulating intensity of the image with a preset constant ratio.

3. A transmission electron microscope system according to claim 1, further comprising:

means provided at an input or output side of at least one of said plurality of frame memories for modulating intensity of the image with a preset constant ratio; and means for outputting as a picture signal a signal indicative of difference in the intensity between said image modulated by said means and an image stored in another one of said plural frame memories.

4. A transmission electron microscope system according to claim 1, wherein the picture signal derived through said comparison and arithmetic processing is generated as a result of division processing performed on said image signals on a pixel-by-pixel basis.

5. A transmission electron microscope system according to claim 1, wherein said picture signal obtained through said comparison and arithmetic processing is equivalent to a two-dimensional distribution map of elements of concern from which background is eliminated.

6. A transmission electron microscope system, comprising:

an electron gun;

an irradiating electron lens system for irradiating a specimen with an electron beam emitted from said electron gun;

an electron image forming electron lens system for forming an image of electrons having passed through said specimen;

an energy filter for spectrally filtering electron beams produced after transmission through said specimen in dependence on energies thereof;

means for selecting only the electron beam having specific energy from the electron beams resulting from said spectral filtering;

image pickup means for taking an image formed by said selected electron beam;

a plurality of frame memories for storing the selected image picked up by said image pickup means;

frame memory selecting means for selecting periodically said frame memories for storing in the selected frame memories the images picked up by said image pickup means, respectively;

means for changing an acceleration voltage for said electron beam in synchronism with selection of the frame memory by said frame memory selecting means; and means for comparing and arithmetically processing the images stored in two of said frame memories on a pixel-by-pixel basis to thereby output corresponding picture signals as a function of time lapse.

7. A transmission electron microscope system according to claim 6, further including means provided at an input or output side of at least one of said plurality of frame memories for modulating intensity of the image at a preset constant ratio.

8. A transmission electron microscope system according to claim 6, further comprising:

means provided at an input or output side of at least one of said plurality of frame memories for modulating intensity of the image with a preset constant ratio; and means for outputting as a picture signal a signal indicative of difference in the intensity between said image modulated by said means and an image stored in another one of said plural frame memories.

9. A transmission electron microscope system according to claim 6, wherein the picture signal derived through said comparison and arithmetic processing is generated as a result of division processing performed on said image signals on a pixel-by-pixel basis.

10. A transmission electron microscope system according to claim 6, wherein said picture signal obtained through said comparison and arithmetic processing is equivalent to a two-dimensional distribution map of elements of concern from which background is eliminated.

11. A method of observing a distribution of elements of concern contained in a specimen by using a transmission electron microscope system, comprising:

a first step of spectrally separating electron beams transmitted through a specimen under observation for picking up an energy-selected image formed by an electron beam having second energy other than first energy undergone energy loss equivalent to core-loss energy of elements of concern to thereby store said energy-selected image in a first frame memory;

a second step of spectrally separating electron beams transmitted through said specimen for picking up an energy-selected image formed by an electron beam having third energy exhibiting an energy difference relative to said second energy, which difference is equal to a difference between said first and second energies, to thereby store said image formed by said electron beam of said third energy in a second frame memory after uniform attenuation of image intensity on a pixel-by-pixel basis;

a third step of determining difference between said filtered image stored in said first frame memory and said filtered image stored in said second frame memory on a pixel-by-pixel basis to thereby output said difference onto picture display means as a picture signal;

a fourth step of setting the image intensity attenuation ratio in said second step so that contrast of the picture displayed on said picture display means in said third step makes disappearance;

a fifth step of spectrally separating electron beams transmitted through said specimen to pick up a picture of an energy-selected image formed by the electron beam having said first energy for thereby storing said energy-selected image in said first frame memory;

a sixth step of spectrally separating electron beams transmitted through said specimen to pick up a picture of an energy-selected image formed by the electron beam having said second energy for thereby storing said energy-selected image in said second frame memory while attenuating image intensity thereof uniformly on a pixel-by-pixel basis with said attenuation ratio determined in said fourth step; and a seventh step of determining difference between the image stored in said first frame memory in said fifth step and the image stored in said second memory in said sixth step to thereby output a signal indicative of said difference to said picture display means as a picture signal;

wherein in said fifth and sixth steps, said energy-selected images having said first and second energies, respectively, are generated by changing correspondingly an electron beam accelerating voltage; and wherein a map of two-dimensional distribution of said elements of concern having background eliminated is obtained by repetitionally executing said fifth to seventh steps.

12. A method of observing a distribution of elements of concern contained in a specimen by using a transmission electron microscope system, comprising:

a first step of spectrally separating electron beams transmitted through a specimen under observation for picking up an energy-selected image formed by an electron beam having second energy other than first energy undergone energy loss corresponding to core-loss energy of said elements of concern to thereby store said energy-selected image in a first frame memory;

a second step of spectrally separating electron beams transmitted through said specimen for picking up an energy-selected image formed by an electron beam having third energy having an energy difference relative to said second energy, which difference is equal to a difference between said first and second energies, to thereby store said image formed by said electron beam of said third energy in a second frame memory;

a third step of attenuating the intensity of the energy-selected image stored in said second frame memory on a pixel-by-pixel basis and determining difference between said attenuated image stored and said filtered image stored in said second frame memory on a pixel-by-pixel basis to thereby output said difference onto picture display means as a picture signal;

a fourth of setting the image intensity attenuation ratio in said second step so that contrast of the picture displayed on said picture display means in said third step makes disappearance;

a fifth step of spectrally separating electron beams transmitted through said specimen to pick up a picture of an energy-selected image formed by the electron beam having said first energy for thereby storing said filtered image in said first frame memory;

a sixth step of spectrally filtering electron beams transmitted through said specimen to pick up a picture of an energy-selected image formed by the electron beam having said second energy for storing said filtered image in said second frame memory; and a seventh step of determining difference between the image stored in said first frame memory in said fifth step and the image stored in said second memory in said sixth step and attenuated with the attenuation ratio set in said fourth step to thereby output a signal indicative of said difference to said picture display means as a picture signal;

wherein in said fifth and sixth steps, said energy-selected images having said first and second energies, respectively, are generated by changing correspondingly an electron beam accelerating voltage; and wherein a map of two-dimensional distribution of said elements of concern having background eliminated is obtained by repetitionally executing said fifth to seventh steps.

13. A method of observing a distribution of elements of concern contained in a specimen by using a transmission electron microscope system, comprising:

a first step including a procedure for spectrally separating electron beams transmitted through a specimen under observation for picking up an energy-selected image formed by an electron beam having second energy other than first energy undergone energy loss equivalent to core-loss energy of elements of concern to thereby store said energy-selected image in a first frame memory and a second procedure for spectrally separating electron beams transmitted through said specimen to pick up a picture of an energy-selected image formed by the electron beam having said first energy for thereby storing said energy-selected image in a second frame memory; and a second step of dividing intensities of the image stored in said first frame memory and the image stored in said second frame memory on a pixel-by-pixel basis to thereby output a signal indicative of a result of the division to said picture display means as a picture signal;

wherein a map of two-dimensional distribution of elements of concern having background eliminated is obtained by repetitionally executing said first and second steps.

* * * * *

UNITED STATES PATENT AND TRADEMARK OFFICE
CERTIFICATE OF CORRECTION

PATENT NO. : 5,578,823
DATED : November 26, 1996
INVENTOR(S) : Yoshifumi TANIGUCHI It is certified that error appears in the above-indentified patent and that said Letters Patent is hereby corrected as shown below:

| Column | Line | |
|---|---|---|
| 3 | 29 | Change "image forming" to --image-forming-- |
| 4 | 6 | After "pixel-by-pixel" insert --basis--. |
| 4 | 10 | After "system" change "," to --.--; change "which" to --This--. |
| 4 | 14 | Before "second" insert --a--; after "second energy" insert --(i.e.,--; after "first energy" insert --which has--. |
| 4 | 15 | Before "core-loss" insert --the--; before "elements" insert '--the--. |
| 4 | 16 | After "concern" insert --,-- and delete "to"; change "store" to --storing--. |
| 4 | 17 | After "memory" change "," to --.--; change "a" to --The--; change "of" to --includes-- |

UNITED STATES PATENT AND TRADEMARK OFFICE
CERTIFICATE OF CORRECTION

PATENT NO. : 5,578,823

DATED : November 26, 1996

INVENTOR(S) : Yoshifumi TANIGUCHI

Page 2 of 4

It is certified that error appears in the above-indentified patent and that said Letters Patent is hereby corrected as shown below:

| Column | Line | |
|---|---|---|
| 4 | 20 | Before "third" insert --a--. |
| 4 | 25 | Change "basis, a" to --basis. The--; after "step" change "of" to --includes--. |
| 4 | 26 | After "determining" insert --the--. |
| 4 | 30 | Change "signal, a" to --signal. The--; change "of" to --includes--. |
| 4 | 31 | Before "contrast" insert --the--. |
| 4 | 32 | Change "makes" to --disappears.--. |
| 4 | 33 | Delete "disappearance,"; change "a" to --The--; change "of" to --includes--. |
| 4 | 37 | Change "memory, a" to --memory. The--; change "of" to --includes--. |

UNITED STATES PATENT AND TRADEMARK OFFICE
CERTIFICATE OF CORRECTION

PATENT NO. : 5,578,823           Page 3 of 4
DATED : November 26, 1996
INVENTOR(S) : Yoshifumi TANIGUCHI It is certified that error appears in the above-indentified patent and that said Letters Patent is hereby corrected as shown below:

| Column | Line | |
|---|---|---|
| 4 | 44 | Change "a seventh step of" to --the seventh step includes--. |
| 6 | 34 | Change "image forming" to --image-forming-- |
| 6 | 42 | Change "δS" to --δE--. |
| 6 | 46 | Change "filer" to --filter--. |
| 7 | 7 | Change "conjunction" to --connection--. |
| 8 | 10 | Change "processing" to --process--. |
| 8 | 32 | Change "(A'-B'xattenuation" to --(A'-B' x attenuation--. |
| 8 | 39 | Change "2/20" to --2/30--. |
| 8 | 54 | Change "processings" to --processes--. |

UNITED STATES PATENT AND TRADEMARK OFFICE
CERTIFICATE OF CORRECTION

PATENT NO. : 5,578,823
DATED : November 26, 1996
INVENTOR(S) : Yoshifumi TANIGUCHI It is certified that error appears in the above-indentified patent and that said Letters Patent is hereby corrected as shown below:

| Column | Line | |
|---|---|---|
| 9 | 5 | Change "differing from" to --(unlike--; after "art" insert --,--. |
| 9 | 6 | Delete "according to" and insert --in--; change "change" to --changes--. |
| 9 | 7 | Change "change" to --changes--; change "is" to --are--. |
| 9 | 8 | Change "pixels." to --pixels). |
| 10 | 50 | Before "arrangement" insert --the--. |
| 14 | 44 | Change "a fourth of" to --a fourth step of--. |

Signed and Sealed this

Eighth Day of July, 1997

Attest:

BRUCE LEHMAN

Attesting Officer

Commissioner of Patents and Trademarks